United States Patent
Sejima

(10) Patent No.: US 11,456,323 B2
(45) Date of Patent: Sep. 27, 2022

(54) IMAGING UNIT

(71) Applicant: SONY SEMICONDUCTOR SOLUTIONS CORPORATION, Kanagawa (JP)

(72) Inventor: Koichi Sejima, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 224 days.

(21) Appl. No.: 16/755,430

(22) PCT Filed: Oct. 18, 2018

(86) PCT No.: PCT/JP2018/038812
§ 371 (c)(1),
(2) Date: Apr. 10, 2020

(87) PCT Pub. No.: WO2019/078291
PCT Pub. Date: Apr. 25, 2019

(65) Prior Publication Data
US 2020/0321364 A1    Oct. 8, 2020

(30) Foreign Application Priority Data

Oct. 20, 2017  (JP) .............................. JP2017-203311
Aug. 29, 2018  (JP) .............................. JP2018-159996

(51) Int. Cl.
*H01L 27/146* (2006.01)
*H04N 5/3745* (2011.01)
*H04N 5/378* (2011.01)

(52) U.S. Cl.
CPC .... *H01L 27/1461* (2013.01); *H01L 27/14607* (2013.01); *H04N 5/378* (2013.01); *H04N 5/37455* (2013.01)

(58) Field of Classification Search
CPC ......... H01L 27/14614; H01L 27/14609; H01L 27/14625; H01L 27/14634; H01L 21/82;
(Continued)

(56) References Cited

U.S. PATENT DOCUMENTS

2006/0197181 A1  9/2006 Noguchi
2008/0157141 A1  7/2008 Han
(Continued)

FOREIGN PATENT DOCUMENTS

CN    101211939 A   7/2008
CN    105190890 A   12/2015
(Continued)

OTHER PUBLICATIONS

International Search Report and Written Opinion of PCT Application No. PCT/JP2018/038812, dated Jan. 22, 2019, 11 pages of ISRWO.

*Primary Examiner* — Tony Ko
(74) *Attorney, Agent, or Firm* — Chip Law Group

(57) ABSTRACT

An imaging unit including first semiconductor substrate that includes a photoelectric converter, a heat conductive wiring line provided in contact with the first semiconductor substrate, and a cooling device that controls a temperature of the photoelectric converter via the heat conductive wiring line.

15 Claims, 11 Drawing Sheets

(58) Field of Classification Search
CPC ........... H01L 27/14603; H01L 27/1463; H01L 29/51; G03B 7/093; H04N 5/3745
See application file for complete search history.

(56) References Cited

U.S. PATENT DOCUMENTS

| | | | |
|---|---|---|---|
| 2009/0199887 A1* | 8/2009 | Johnson | ............... H01L 27/16 136/239 |
| 2016/0049430 A1 | 2/2016 | Nomura | |
| 2017/0078597 A1 | 3/2017 | Funaki | |
| 2018/0026012 A1 | 1/2018 | Akutsu et al. | |

FOREIGN PATENT DOCUMENTS

| | | |
|---|---|---|
| CN | 107112314 A | 8/2017 |
| DE | 102007051312 A1 | 7/2008 |
| JP | 08-288486 A | 11/1996 |
| JP | 2006-228834 A | 8/2006 |
| JP | 2006-237050 A | 9/2006 |
| JP | 2006-245311 A | 9/2006 |
| JP | 2008-166725 A | 7/2008 |
| JP | 2012-099743 A | 5/2012 |
| JP | 2013-141037 A | 7/2013 |
| JP | 2015-135932 A | 7/2015 |
| JP | 2016-131245 A | 7/2016 |
| JP | 2017-059937 A | 3/2017 |
| KR | 10-2008-0062045 A | 7/2008 |
| KR | 10-2015-0135265 A | 12/2015 |
| KR | 10-2017-0093171 A | 8/2017 |
| TW | 200828583 A | 7/2008 |
| TW | 201639115 A | 11/2016 |
| WO | 2014/156933 A1 | 10/2014 |
| WO | 2014/192199 A1 | 12/2014 |
| WO | 2016/114318 A1 | 7/2016 |

* cited by examiner

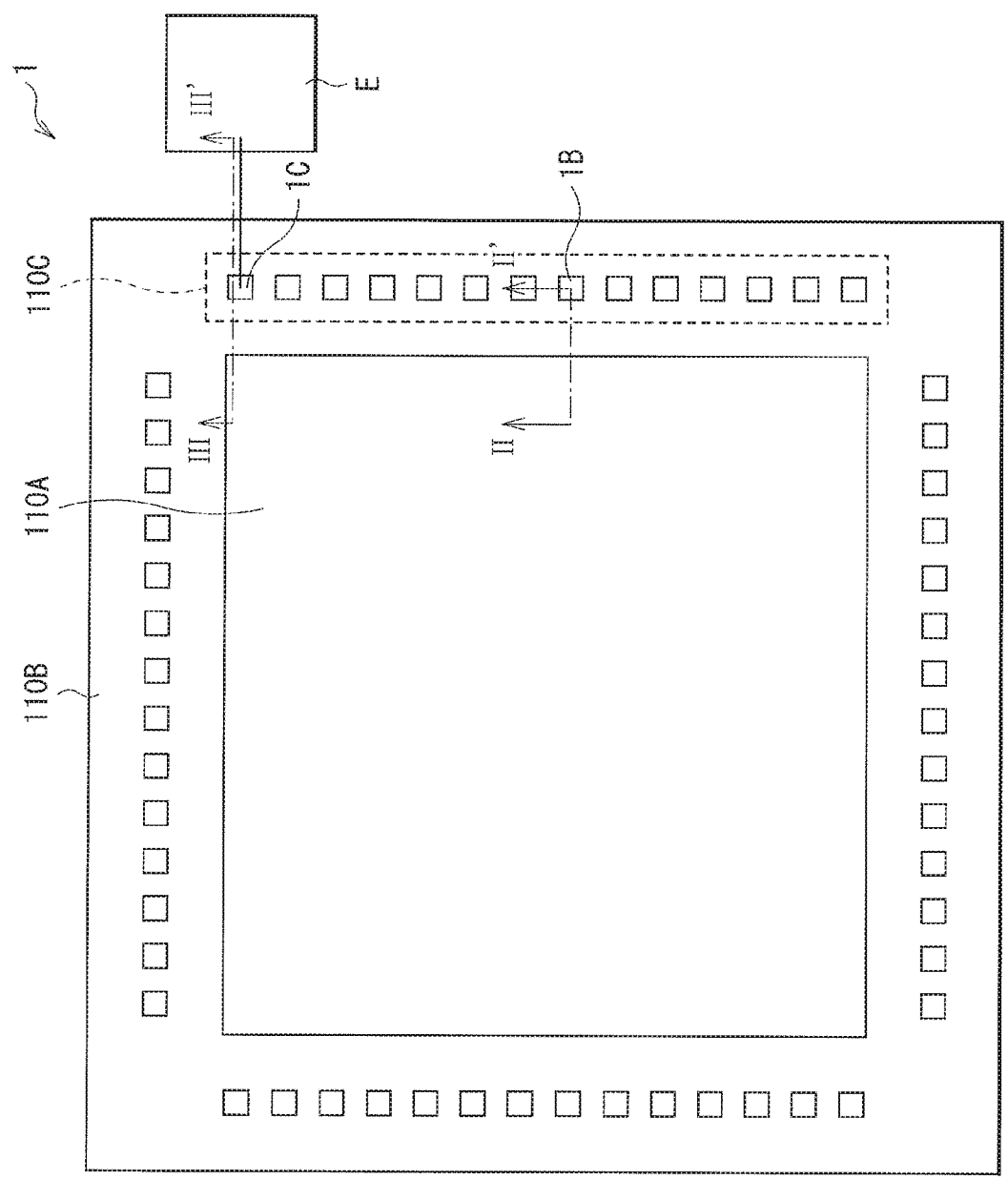
[FIG. 1]

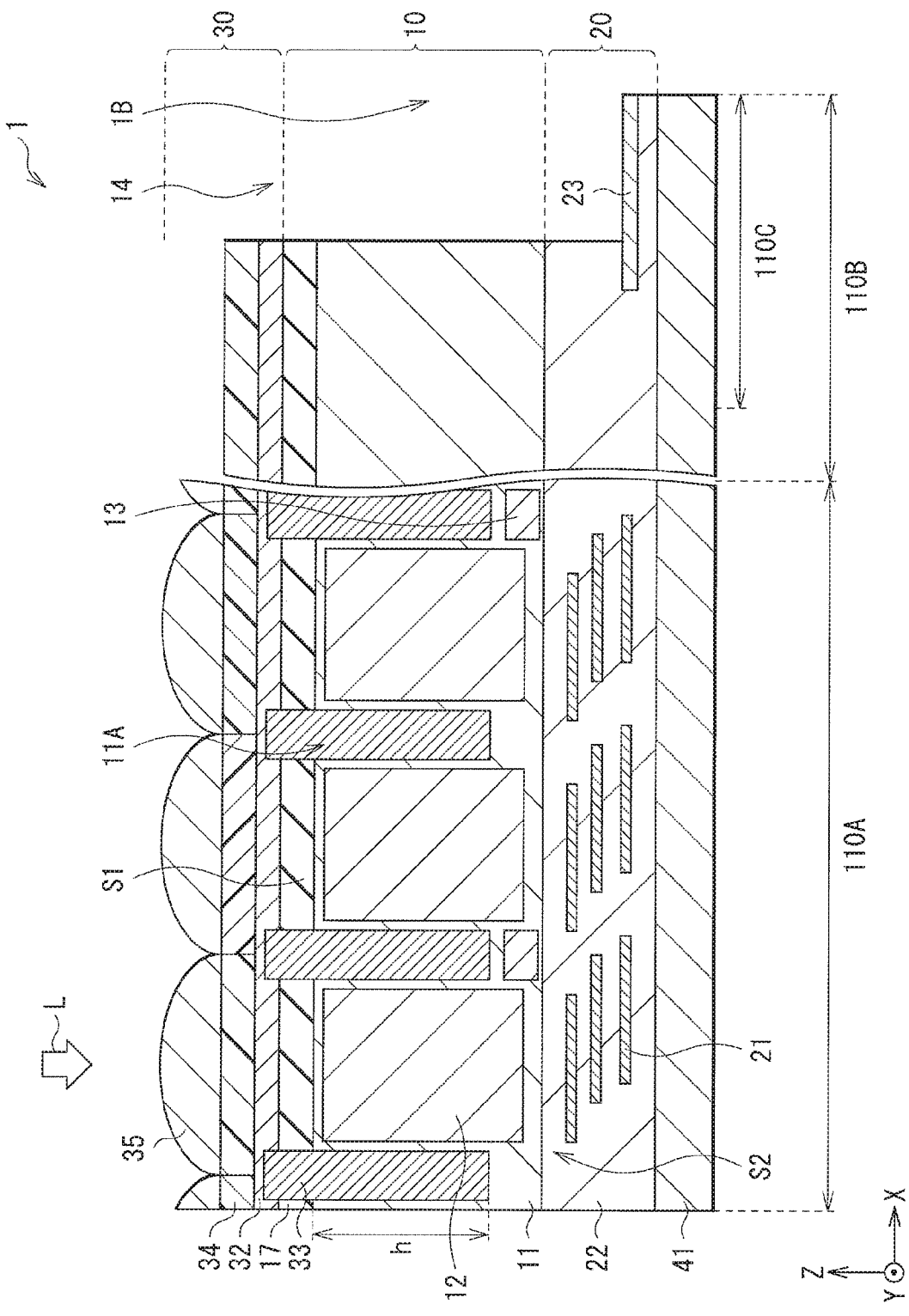
[FIG. 2]

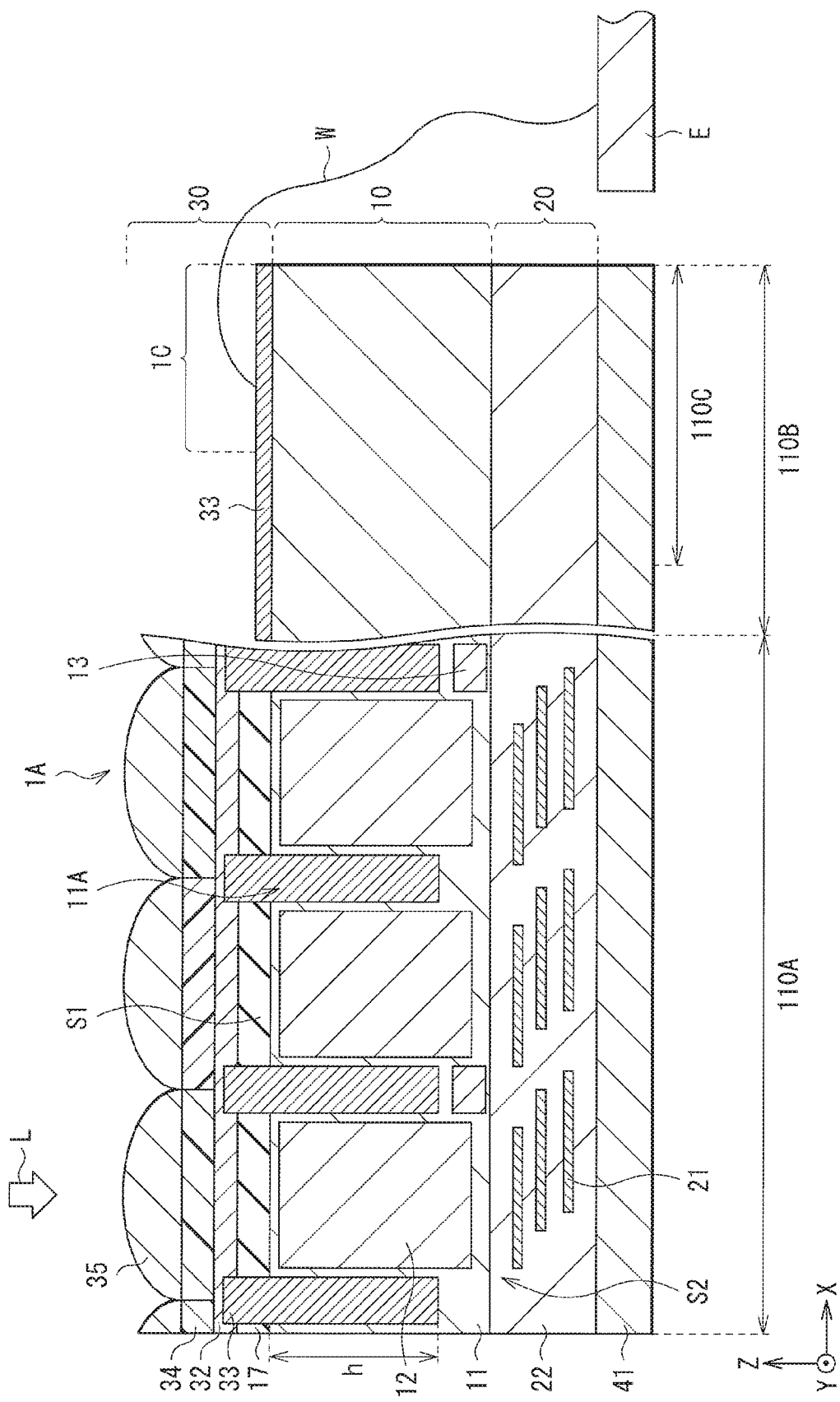
[FIG. 3]

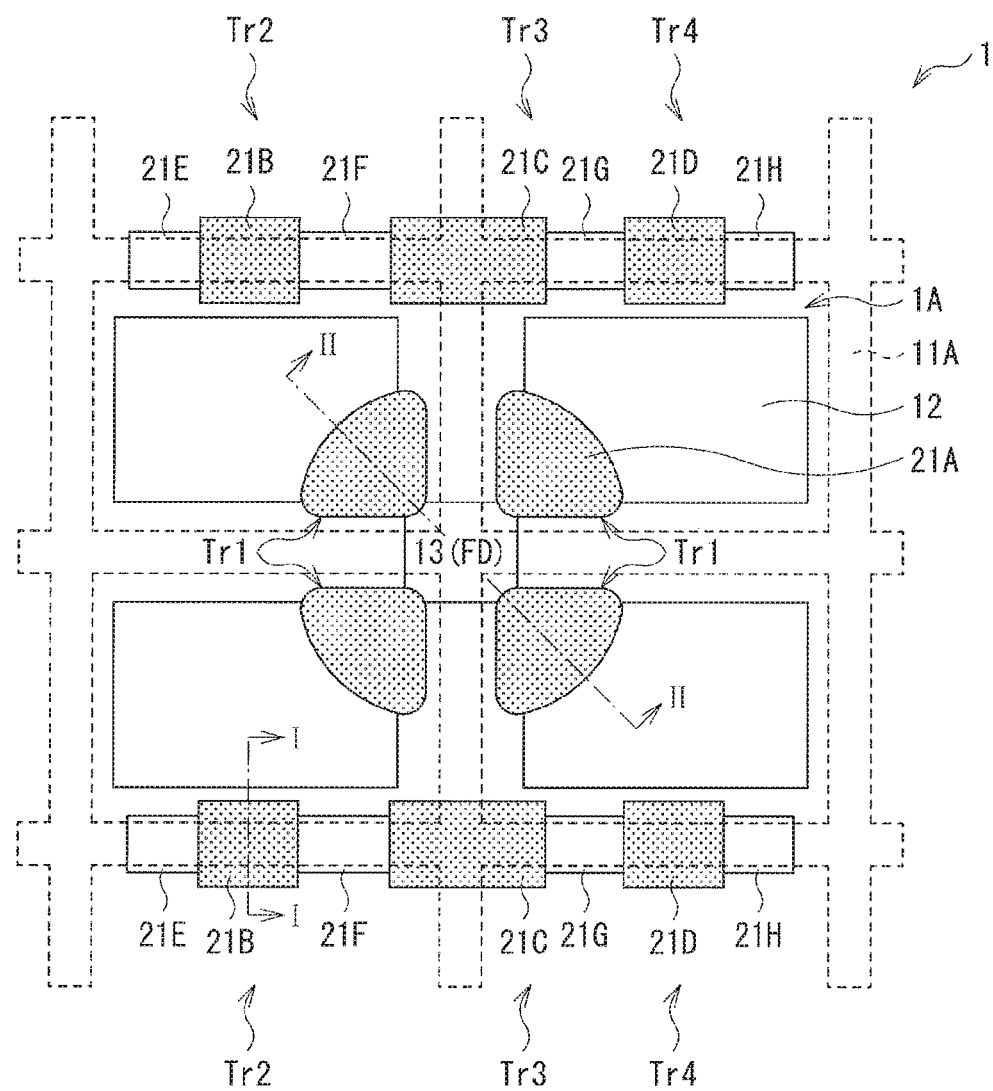
[FIG. 4]

[FIG. 5]
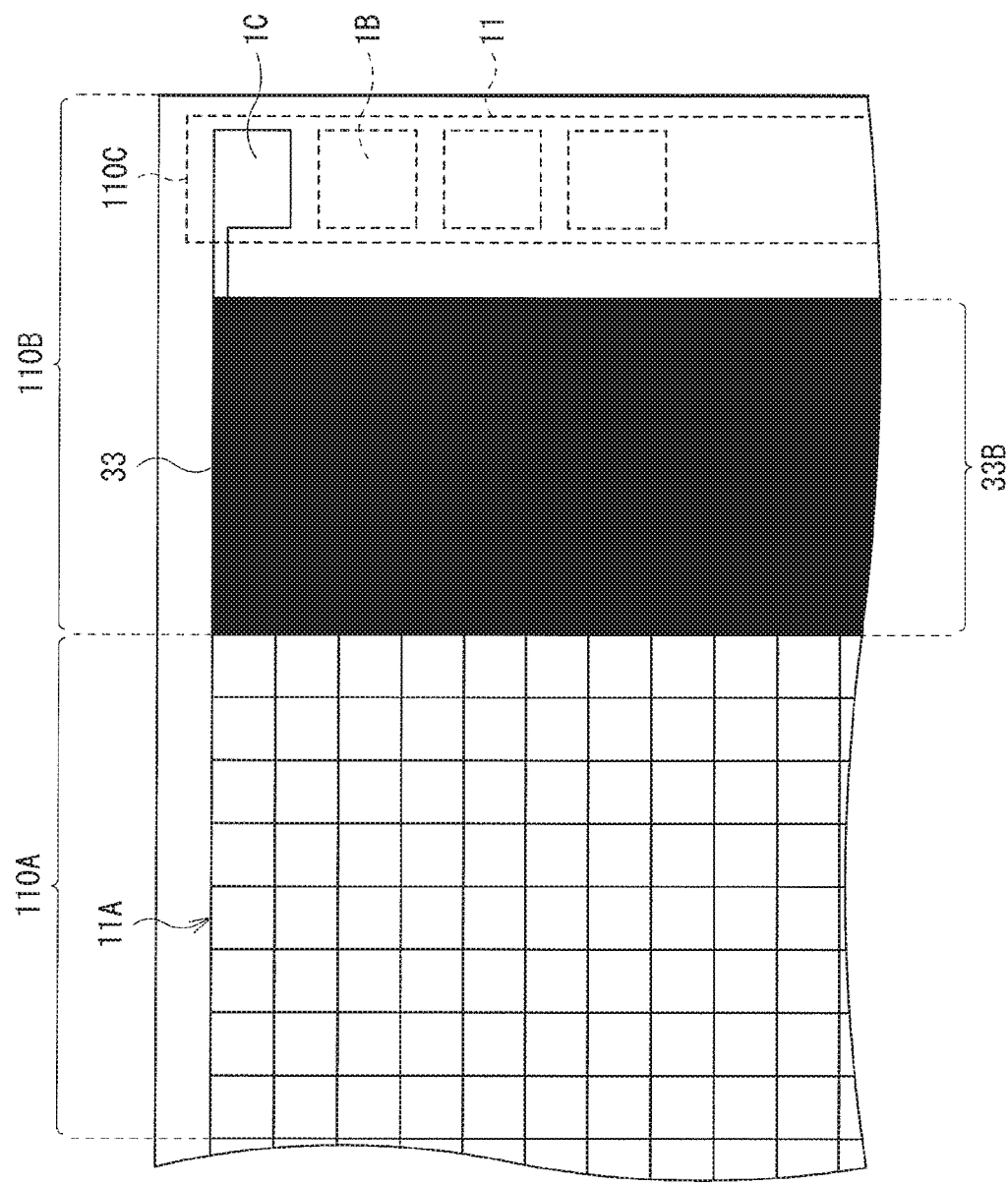

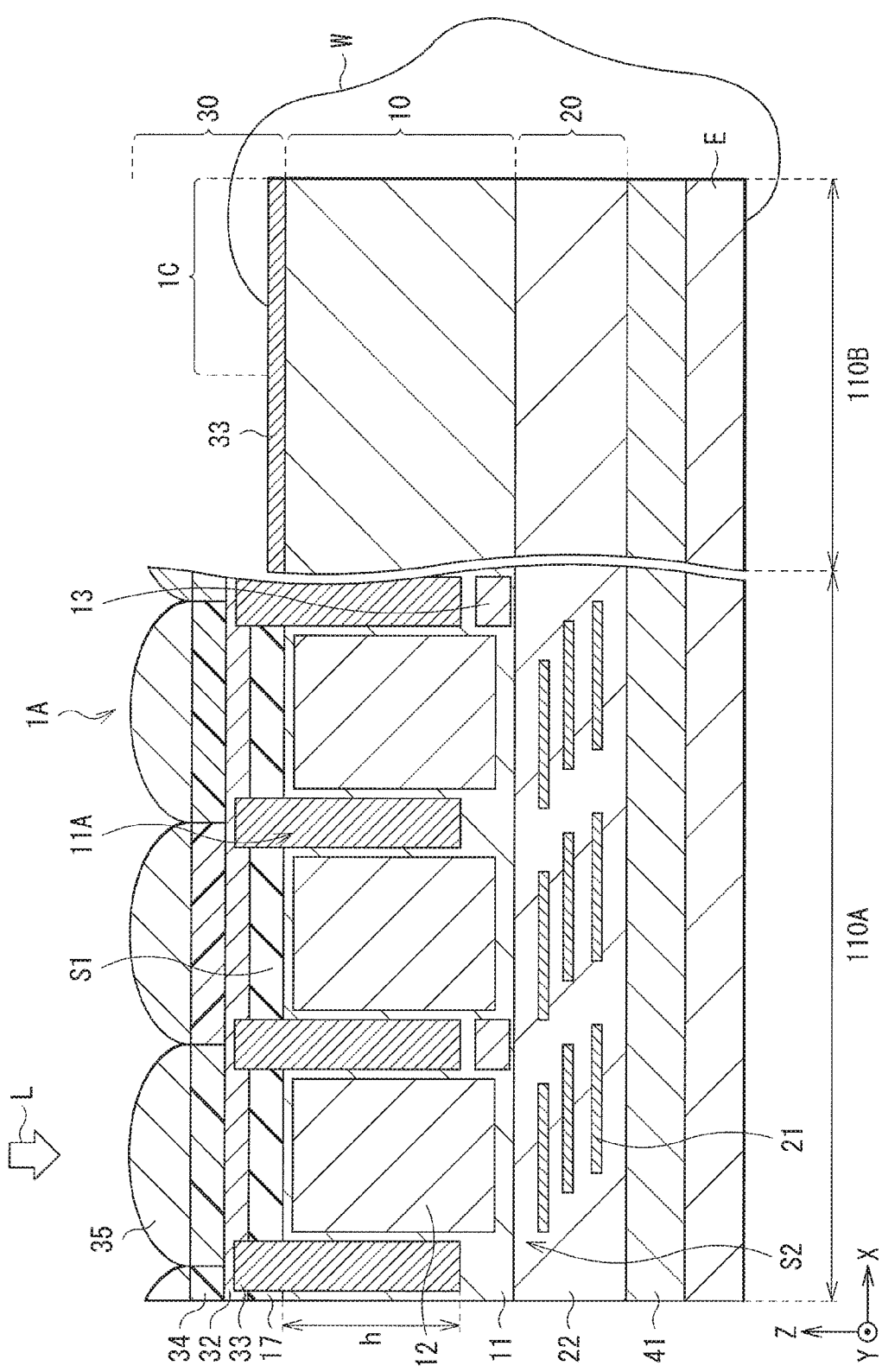
[FIG. 6]

[FIG. 7]
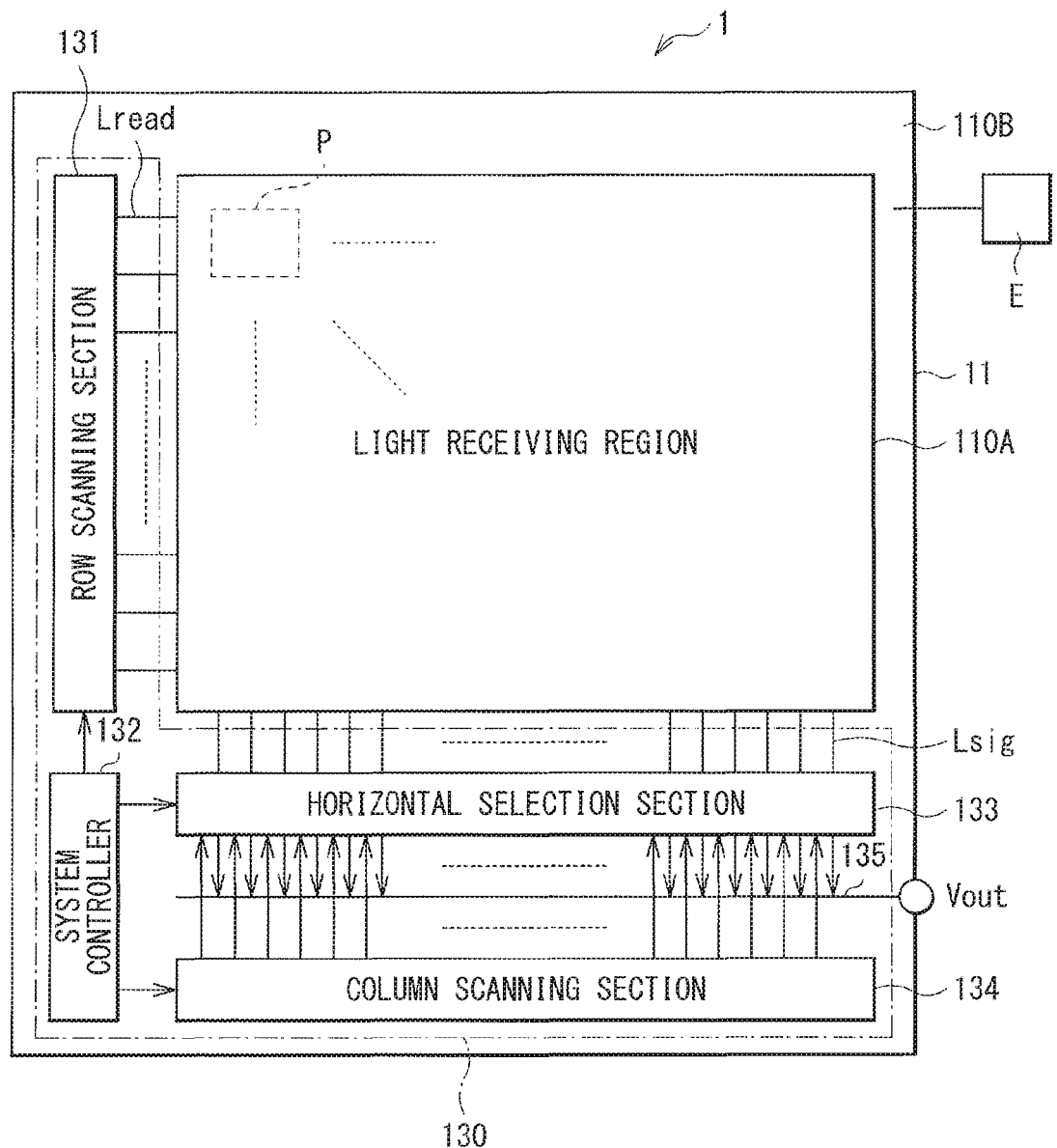

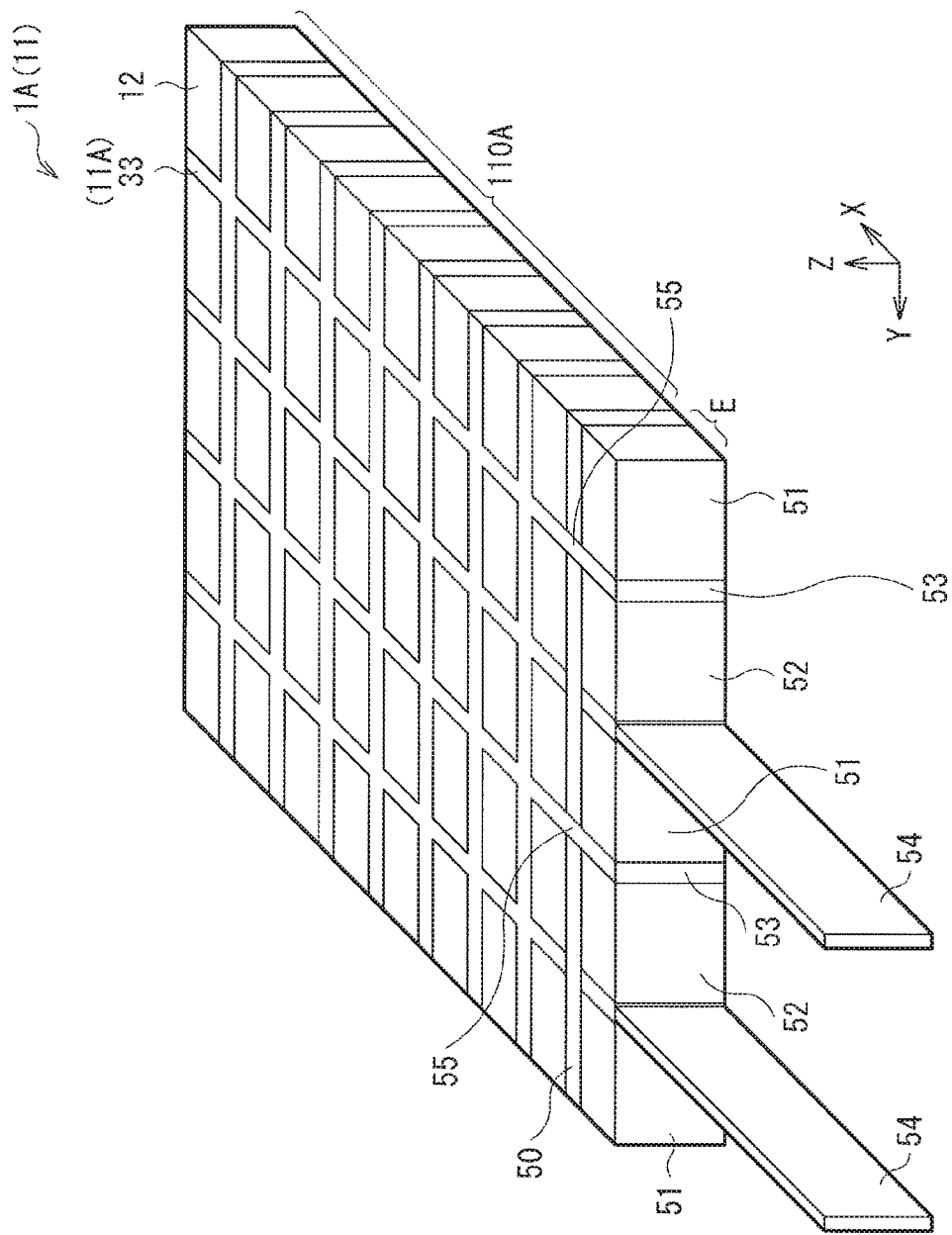
[FIG. 8]

[FIG. 9]
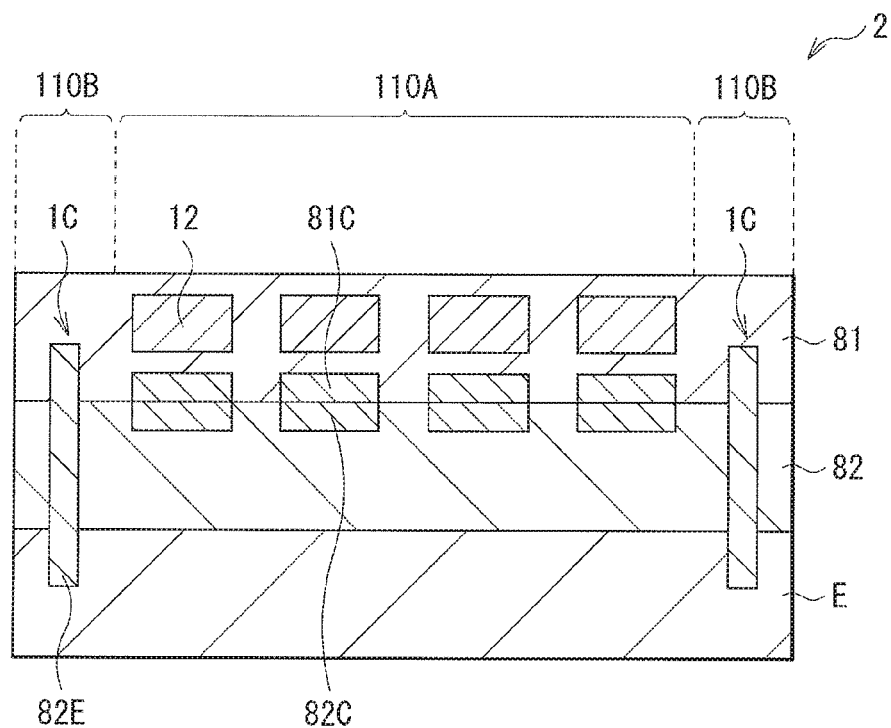
[FIG. 10]
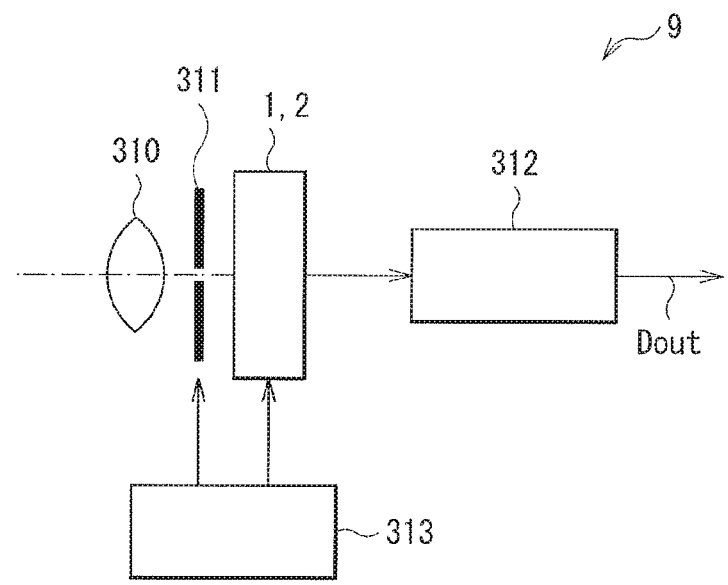

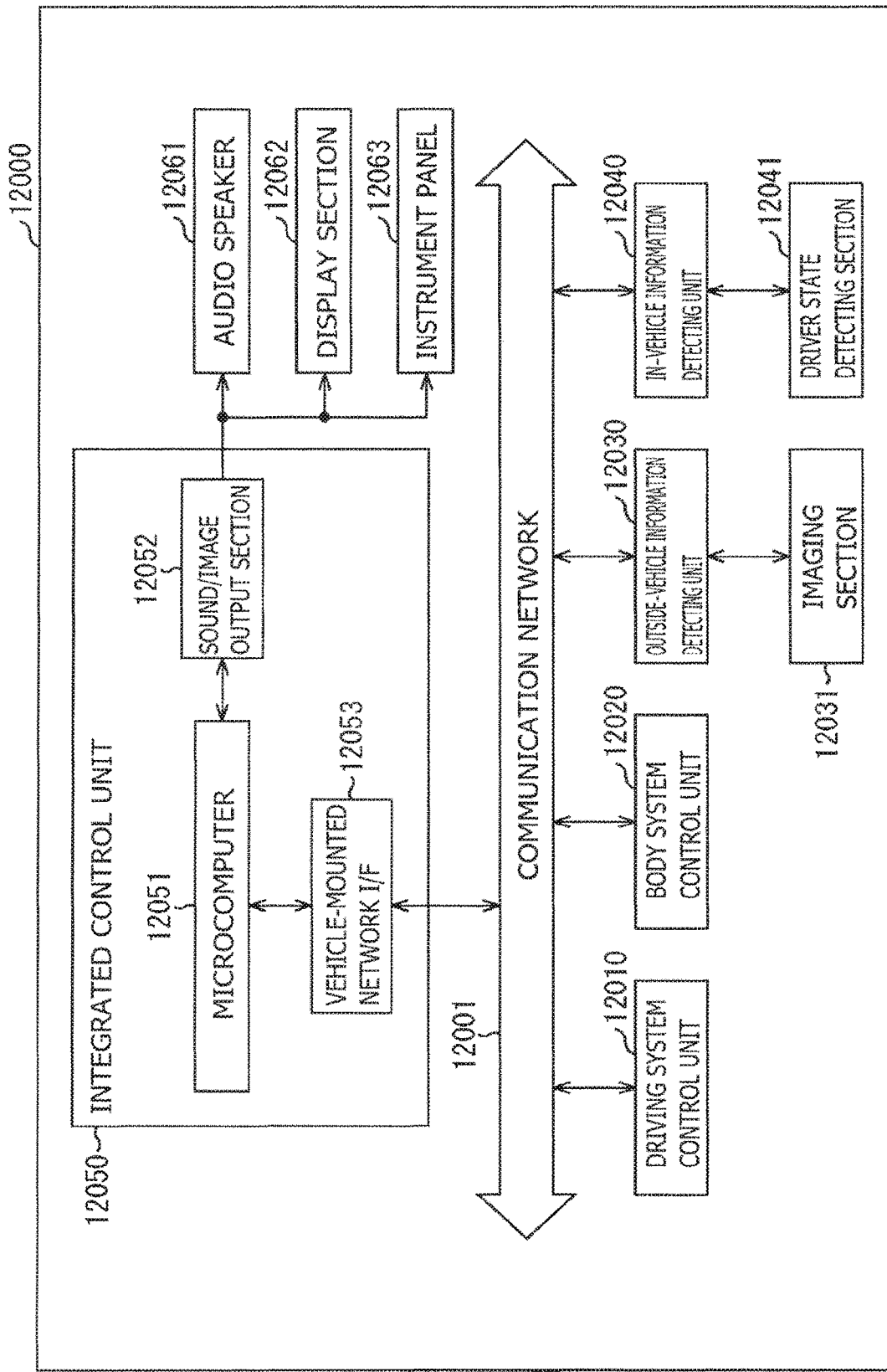
[FIG. 11]

[FIG. 12]
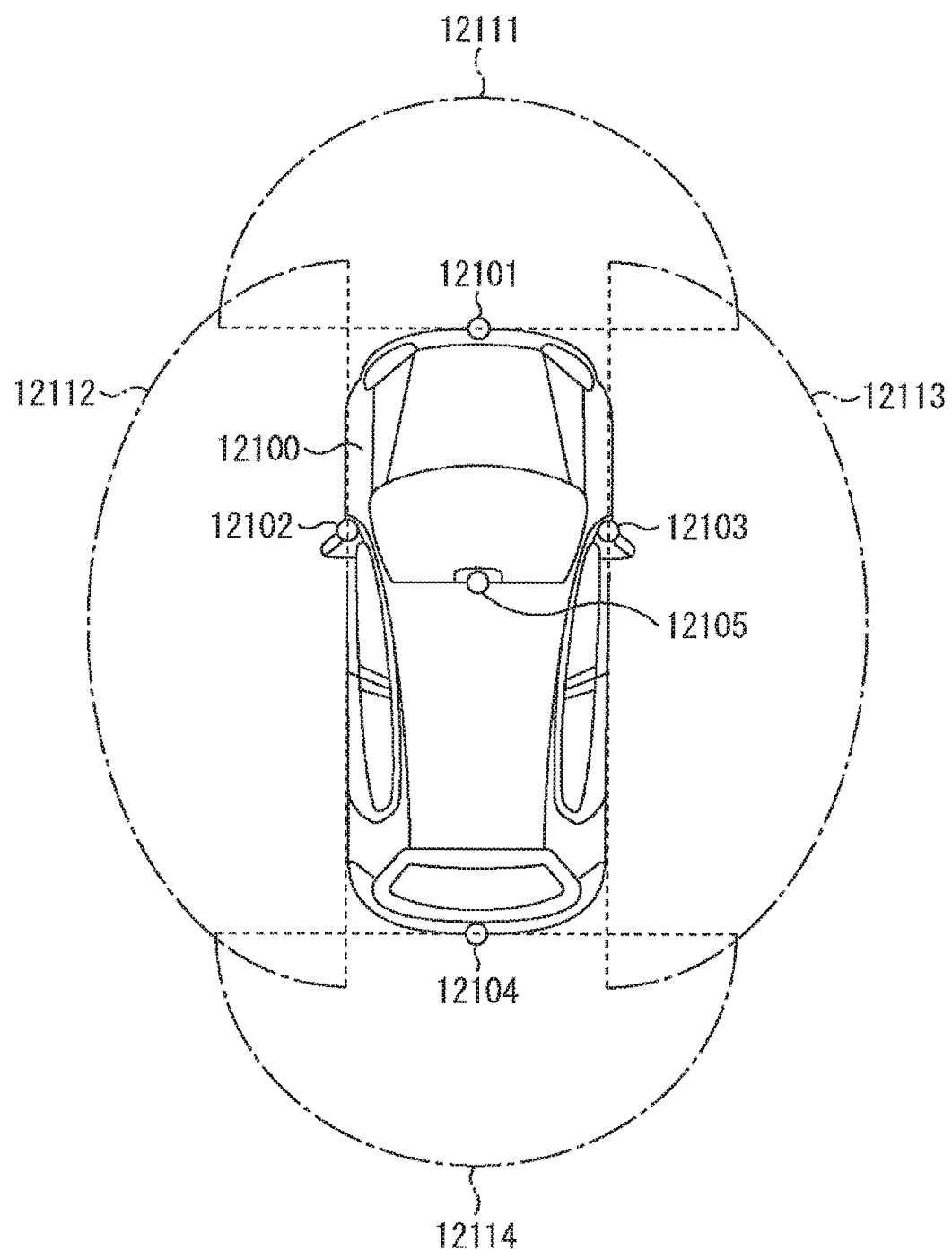

IMAGING UNIT

CROSS REFERENCE TO RELATED APPLICATIONS

This application is a U.S. National Phase of International Patent Application No. PCT/JP2018/038812 filed on Oct. 18, 2018, which claims priority benefit of Japanese Patent Application No. JP 2018-159996 filed in the Japan Patent Office on Aug. 29, 2018 and also claims priority benefit of Japanese Patent Application No. JP 2017-203311 filed in the Japan Patent Office on Oct. 20, 2017. Each of the above-referenced applications is hereby incorporated herein by reference in its entirety.

TECHNICAL FIELD

The present disclosure relates to an imaging unit including a semiconductor substrate.

BACKGROUND ART

A solid-state imaging unit (imaging unit) such as a CCD (Charge Coupled Device) image sensor and a CMOS (Complementary Metal Oxide Semiconductor) image sensor includes a photoelectric converter (for example, a photodiode (PD: Photo Diode)) for each pixel.

The imaging unit enables suppression of a dark current, for example, by cooling (for example, see PTL 1).

CITATION LIST

Patent Literature

PTL 1: Japanese Unexamined Patent Application Publication No. 2015-135932

SUMMARY OF THE INVENTION

Such an imaging unit is desired to cool a photoelectric converter more efficiently.

Therefore, it is desirable to provide an imaging unit that enables more efficient cooling of a photoelectric converter.

An imaging unit according to an embodiment of the present disclosure includes a first semiconductor substrate, a heat conductive wiring line, and a cooling device. The first semiconductor substrate includes a photoelectric converter. The heat conductive wiring line is provided in contact with the first semiconductor substrate. The cooling device controls a temperature of the photoelectric converter via the heat conductive wiring line.

In the imaging unit according to the embodiment of the present disclosure, the heat conductive wiring line is provided in contact with the first semiconductor substrate. The first semiconductor substrate is therefore efficiently cooled by the cooling device via the heat conductive wiring line.

It is noted that the above-described contents are examples of the present disclosure. Effects of the present disclosure are not limited to those described above, may be other different effects, or may further include other effects.

BRIEF DESCRIPTION OF THE DRAWINGS

FIG. 1 is a schematic plan view illustrating an outline of a configuration of an imaging unit according to an embodiment of the present disclosure.

FIG. 2 is a schematic diagram illustrating a cross-sectional configuration taken along a line II-II' illustrated in FIG. 1.

FIG. 3 is a schematic diagram illustrating a cross-sectional configuration taken along a line III-III' illustrated in FIG. 1.

FIG. 4 is a plan view schematically illustrating a configuration of a light receiving region illustrated in FIG. 1.

FIG. 5 is a schematic plan view illustrating a configuration of a heat conductive wiring line illustrated in FIGS. 2 and 3.

FIG. 6 is a schematic cross-sectional view illustrating another configuration of a cooling device illustrated in FIG. 3.

FIG. 7 is a functional block diagram of the imaging unit illustrated in FIG. 1.

FIG. 8 is a perspective view illustrating a schematic configuration of a main portion of an imaging unit according to modification example 1.

FIG. 9 is a schematic cross-sectional view illustrating an outline of a configuration of an imaging unit according to modification example 2.

FIG. 10 is a functional block diagram illustrating an example of an electronic apparatus (a camera) using the imaging unit illustrated in FIG. 1 and the like.

FIG. 11 is a block diagram depicting an example of schematic configuration of a vehicle control system.

FIG. 12 is a diagram of assistance in explaining an example of installation positions of an outside-vehicle information detecting section and an imaging section.

MODES FOR CARRYING OUT THE INVENTION

Hereinafter, embodiments of the present disclosure will be described in detail with reference to the drawings. It is to be noted that the description is given in the following order.
1. Embodiment (an imaging unit including a heat conductive wiring line in contact with a first semiconductor substrate)
2. Modification Example 1 (an example in which a cooling device is provided in the first semiconductor substrate)
3. Modification Example 2 (an example in which a stacked structure of a plurality of semiconductor chips is provided)
4. Application Examples (examples of electronic apparatuses)
5. Adaptation Examples (examples of adaptation to mobile bodies)

Embodiment

FIG. 1 schematically illustrates an overall configuration of an imaging unit (an imaging unit 1) according to an embodiment of the present disclosure. The imaging unit 1 is used for, for example, a CCD image sensor, a CMOS image sensor, or the like. The imaging unit 1 includes a light receiving region 110A, a peripheral region 110B, and a cooling device E. The light receiving region 110A includes a plurality of pixels P (see FIG. 7 described later). The peripheral region 110B is provided outside the light receiving region 110A and includes a peripheral circuit (for example, a peripheral circuit portion 130 illustrated in FIG. 7 described later). The cooling device E is directed to cooling of the light receiving region 110A. The peripheral region 110B is provided with a coupling region 110C as well as the peripheral circuit. This coupling region 110C includes an electric coupling portion 1B that allows for electrical coupling to an outside, and a heat coupling portion 1C to which the cooling device E is coupled.

FIG. 2 schematically illustrates a cross-sectional configuration taken along a line II-II' in FIG. 1. FIG. 3 schematically illustrates a cross-sectional configuration taken along a line III-III' in FIG. 1. The imaging unit 1 includes a wiring layer 20 and a support substrate 41 on front surface (surface S2) side of the semiconductor substrate 11 (a first semiconductor substrate) that configures a light receiving portion 10. The imaging unit 1 includes a light collector 30 on back surface (light incident surface; light receiving surface S1) side of the semiconductor substrate 11. The light collector 30 includes an on-chip lens 35 and the like.

The light receiving portion 10 includes the semiconductor substrate 11 with a PD 12 (a photoelectric converter) embedded therein, and a protective film 17 provided on the back surface of the semiconductor substrate 11. A plurality of wiring lines 21 is provided in the wiring layer 20 with an interlayer insulating film 22 in between. The light collector 30 includes the on-chip lenses 35 each of which is disposed to be opposed to the corresponding PD 12 in each pixel P. The light collector 30 includes a planarization film 32 and a color filter 34 in order from the light receiving portion 10 side, between the light receiving portion 10 (specifically, the protective film 17) and the on-chip lens 35. The light collector 30 is provided with heat conductive wiring lines 33 each being disposed between the pixels P on the protective film 17.

FIG. 4 schematically illustrates a planar configuration of the light receiving region 110A. The imaging unit 1 is, for example, a back-illuminated imaging unit. The imaging unit 1 includes, for example, four photoelectric converters (photodiodes (PDs) 12) that share a required pixel transistor; in other words, it has a so-called four-pixel supply as a unit.

(Configuration of Each Portion)

The semiconductor substrate 11 includes, for example, p-type silicon (Si). This semiconductor substrate 11 is provided with a pixel isolation trench 11A. The pixel isolation trench 11A extends from the light receiving surface S1 side of the semiconductor substrate 11 in a thickness direction (Z direction) of the semiconductor substrate 11. This pixel isolation trench 11A is provided between adjacent pixels P (PDs 12). This pixel isolation trench 11A is so disposed in a grid pattern as to surround the pixels P (FIG. 4), for example. The pixel isolation trench 11A is so disposed as to overlap, for example, a floating diffusion (FD) 13 and source/drain regions 21E to 21H, which will be described later. It is sufficient that a depth (a height (h)) of the pixel isolation trench 11A is a depth that enables suppression of crosstalk. In a case where a thickness of each of the FD 13 and the source/drain regions 21E to 21H is to be 1 μm or less, the depth (the height (h)) of the pixel isolation trench 11A is preferably, for example, 0.25 μm or more and 5 μm or less. It is sufficient that a width (W) is a width that enables suppression of crosstalk and the width (W) is 100 nm or more and 500 nm or less.

A transfer transistor Tr1 (FIG. 4) is disposed in the vicinity of the front surface (the surface S2) of the semiconductor substrate 11. The transfer transistor Tr1 transfers a signal charge generated in the PD 12 to, for example, a vertical signal line Lsig (see FIG. 7 described later). A gate electrode TG1 of the transfer transistor Tr1 is included in, for example, the wiring layer 20. The signal charge may be either an electron or a hole generated by photoelectric conversion; however, a description will be given here of a case where an electron is read out as the signal charge, by way of example.

For example, a reset transistor Tr2, an amplifying transistor Tr3, a selection transistor Tr4, and the like are provided together with the above-described transfer transistor Tr1 in the vicinity of the surface S2 of the semiconductor substrate 11. Each of such transistors is, for example, a MOSEFT (Metal Oxide Semiconductor Field Effect Transistor) and configures a circuit for each pixel P. Each circuit may have, for example, a three-transistor configuration that includes the transfer transistor, the reset transistor, and the amplifying transistor. Alternatively, each circuit may have a four-transistor configuration that has a selection transistor added thereto. Any transistor other than the transfer transistor can also be shared among the pixels. Further, a FD 13 is formed in the vicinity of the surface S2 of the semiconductor substrate 11, among the four pixels (specifically, the FD 13 is formed at a center portion of the PDs 12 formed in two rows and two columns as illustrated in FIG. 4). This FD 13 is, for example, an n-type semiconductor region that is formed by implanting an n-type impurity at a high concentration into a p-well layer formed on the front surface side of the semiconductor substrate 11.

The PD 12 provided in the semiconductor substrate 11 has a function (a photoelectric conversion function) of, for example, converting incident light L into an electron. This PD 12 is, for example, an n-type semiconductor region formed in the thickness direction (the Z direction) of the semiconductor substrate 11 (here, a Si substrate) for each pixel P. The PD 12 serves as a pn-junction photodiode together with a p-type semiconductor region provided in the vicinity of the front surface and the back surface of the semiconductor substrate 11. In the semiconductor substrate 11, for example, a p-type semiconductor region is also formed between the pixels P, and the pixel isolation trench 11A is provided in this p-type semiconductor region. A tip of the pixel isolation trench 11A does not need to reach the p-well layer formed around the FD 13.

The transfer transistor Tr1 includes the FD 13 and a transfer gate electrode 21A. The transfer gate electrode 21A is formed, as one wiring line 21, in the wiring layer 20 in the vicinity of the surface S2 of the semiconductor substrate 11 between the PD 12 and the FD 13, with the interlayer insulating film 22 in between.

The reset transistor Tr2, the amplifying transistor Tr3, and the selection transistor Tr4 among pixel transistors are formed for every four PDs 12 that share the FD 13. These pixel transistors are disposed on one side of a group including four PDs 12 as illustrated in FIG. 4.

The reset transistor Tr2 includes a pair of source and drain regions 21E and 21F and a reset gate electrode 21B formed between these source and drain regions 21E and 21F. The amplifying transistor Tr3 includes a pair of source and drain regions 21F and 21G and an amplifying gate electrode 21C formed between these source and drain regions 21F and 21G. The selection transistor Tr4 includes a pair of source and drain regions 21G and 21H and a reset gate electrode 21D formed between these source and drain regions 21G and 21H.

Each of the reset transistor Tr2, the amplifying transistor Tr3, and the selection transistor Tr4 has a configuration similar to that of the transfer transistor Tr1. That is, the source/drain regions 21E to 21H each include an n-type high-concentration impurity region formed within a p-well layer of the semiconductor substrate 11, as with the FD 13.

The protective film 17 planarizes the light receiving surface S1 of the semiconductor substrate 11. The protective film 17 has a hole at a position that overlaps the pixel isolation trench 11A of the semiconductor substrate 11. Each hole communicates with the pixel isolation trench 11A. The protective film 17 includes, for example, a single-layer film of silicon nitride ($Si_2N_3$), silicon oxide ($SiO_2$), silicon oxynitride (SiON), or the like, or a laminated film thereof. A thickness of the protective film 17 is preferably 0.05 µm or more and 0.30 µm or less, for example.

The heat conductive wiring line 33 is provided on the light receiving surface Si side of the protective film 17 (the light receiving portion 10). This heat conductive wiring line 33 includes a material that has high heat conductivity and a light shielding property against the light L incident on the PD 12. This heat conductive wiring line 33 is disposed between adjacent pixels P (PDs 12) in the light receiving region 110A. As the material of the heat conductive wiring line 33, for example, tungsten (W), copper (Cu), titanium (Ti), tantalum (Ta), aluminum (Al), ruthenium (Ru), graphite, or the like can be mentioned. The heat conductive wiring line 33 may include an alloy containing tungsten, copper, titanium, tantalum, aluminum, or ruthenium. A film thickness of the heat conductive wiring line 33 is, for example, 20 nm or more and 10000 nm or less.

The heat conductive wiring line 33 provided between the adjacent pixels P is so provided as to fill the hole in the protective film 17 and the pixel isolation trench 11A from above the protective film 17. That is, the heat conductive wiring line 33 is provided in contact with the semiconductor substrate 11 and adjacent to the PD 12. In the present embodiment, this heat conductive wiring line 33 extends to the heat coupling portion 1C (the coupling region 110C) to be thereby thermally coupled to the cooling device E. Therefore, temperature control is performed by the cooling device E via the heat conductive wiring line 33, thereby efficiently cooling the vicinity of the PD 12. Because of such a cooling function and the light shielding property of the heat conductive wiring line 33, it is possible to suppress color mixing caused by crosstalk or the like between the adjacent pixels.

FIG. 5 schematically illustrates a portion of a shape of a plane (the light receiving surface S1) of the heat conductive wiring line 33. The heat conductive wiring line 33 in the light receiving region 110A is so provided in the grid pattern as to surround the pixels P. In a portion of the peripheral region 110B, the heat conductive wiring line 33 extending from the light receiving region 110A is provided on the light receiving surface S1 of the semiconductor substrate 11 in a form of a solid film (a solid film portion 33B). Providing of such a solid film portion 33B allows the heat conductive wiring line 33 to cool the semiconductor substrate 11 more efficiently. Further, the solid film portion 33B also functions as an optical black region directed to measuring an electric potential at light intensity of zero and correcting a dark current. For example, the heat conductive wiring line 33 extends from the light receiving region 110A to the coupling region 110C via this solid film portion 33B. The heat coupling portion 1C is, for example, a portion, of the heat conductive wiring line 33, that is exposed from the planarization film 32 or the like (FIG. 3). The heat coupling portion 1C has, for example, a rectangular planar shape. The heat coupling portion 1C has approximately the same planar shape as the electric coupling portion 1B. The heat coupling portion 1C is disposed alongside the electric coupling portion 1B.

The electric coupling portion 1B is a so-called electrode pad. For example, a plurality of electric coupling portions 1B is provided in the coupling region 110C. This electric coupling portion 1B is a portion, of the wiring line 23 (FIG. 2), that is exposed from an opening 14 over a wiring line 23 provided in the wiring layer 20.

The planarization film 32 is so provided on the light receiving surface S1 side of the heat conductive wiring line 33 and the protective film 17 as to cover the heat conductive wiring line 33 and the protective film 17. This planarization film 32 includes, for example, a single-layer film of silicon nitride ($Si_2N_3$), silicon oxide ($SiO_2$), silicon oxynitride (SiON), or the like, or a laminated film thereof.

The color filter 34 is disposed, for example, between the planarization film 32 and the on-chip lens 35. This color filter 34 is, for example, any one of a red (R) filter, a green (G) filter, a blue (B) filter, and a white filter (W), and is provided for each pixel P, for example. These color filters 34 are provided in a regular color array (for example, the Bayer array). Providing such color filters 34 allows the imaging unit 1 to acquire color light receiving data corresponding to the color array.

The on-chip lens 35 has a function of collecting light toward the light receiving portion 10 (specifically, the PD 12 of the light receiving portion 10). A lens system of this on-chip lens 35 is set to a value corresponding to the size of the pixel P, which is, for example, 0.05 µm or more and 1.00 µm or less. Further, the on-chip lens 35 has a refractive index of, for example, 1.4 or more and 2.0 or less. As a lens material, for example, an organic material, a silicon oxide film ($SiO_2$), and the like can be mentioned.

The support substrate 41 is opposed to the semiconductor substrate 11 with the wiring layer 20 interposed therebetween. This support substrate 41 is directed to securing the strength of the semiconductor substrate 11 at a manufacturing stage. The support substrate 41 includes, for example, a silicon (Si) substrate.

The cooling device E includes, for example, a Peltier device or the like. The cooling device E is thermally coupled to the heat coupling portion 1C by, for example, wire bonding. A wire (a wire W) is provided between the cooling device E and the heat coupling portion 1C and couples them (FIG. 3). This allows the cooling device E to control the temperature of the PD 12 via the heat conductive wiring line 33. The cooling device E may be disposed apart from the semiconductor substrate 11 (FIGS. 1 and 3).

As illustrated in FIG. 6, the cooling device E may be disposed to be opposed to the semiconductor substrate 11. For example, the cooling device E is opposed to the semiconductor substrate 11 with the wiring layer 20 and the support substrate 41 interposed therebetween, whereby these are in contact with one another. Thus providing the cooling device E to be stacked on the semiconductor substrate 11 allows the cooling device E to directly cool the semiconductor substrate 11. This allows for more efficient cooling of the semiconductor substrate 11.

(Overall Configuration)

FIG. 7 illustrates a block diagram of an overall configuration of the imaging unit 1. This imaging unit 1 configures, for example, a CMOS image sensor, and has the light receiving region 110A as an imaging region in a middle portion on the semiconductor substrate 11. The peripheral circuit portion 130 is provided in the peripheral region 110B outside the light receiving region 110A. The peripheral circuit portion 130 includes, for example, a row scanning section 131, a system controller 132, a horizontal selection section 123, and a column scanning section 134.

The light receiving region 110A includes a plurality of unit pixels P arranged two-dimensionally in rows and columns, for example. In this unit pixel P, for example, a pixel drive line Lread (specifically, a row select line and a reset control line) is disposed for each pixel row, while a vertical signal line Lsig is disposed for each pixel column. The pixel drive line Lread transmits a drive signal directed to reading out a signal from a pixel. One end of the pixel drive line Lread is coupled to an output terminal corresponding to each row of the row scanning section 131.

The row scanning section 131 includes, for example, a shift register, an address decoder, and the like. The row scanning section 131 is a pixel driving section that drives each pixel P of the light receiving region 110A for each row unit, for example. A signal outputted from each pixel P of the pixel row selected by the row scanning section 131 is supplied to the horizontal selection section 123 through a corresponding one of the vertical signal lines Lsig. The horizontal selection section 123 includes, for example, amplifiers, horizontal selection switches, and the like which are provided for the respective vertical signal lines Lsig.

The column scanning section 134 includes a shift register, an address decoder, and the like. The column scanning section 134 sequentially drives horizontal selection switches of the horizontal selection section 123 while scanning them. Performing the selective scanning with the column scanning section 134 causes the signals of the respective pixels P transmitted through the respective vertical signal lines Lsig to be sequentially outputted to horizontal signal lines 135 and transmitted to an outside of the semiconductor substrate 11 through the horizontal signal lines 135.

The circuit portion that includes the row scanning section 131, the horizontal selection section 123, the column scanning section 134, and the horizontal signal lines 135 may be formed directly on the semiconductor substrate 11 or alternatively may be disposed in an external controller IC. This circuit portion can also be provided in any other substrate coupled by a cable or the like.

The system controller 132 receives a clock, data instructing an operation mode, and the like that are supplied from the outside of the semiconductor substrate 11, and outputs internal information regarding the imaging unit 1. In addition thereto, the system controller 132 includes, for example, a timing generator that generates various timing signals. The system controller 132 performs drive control of peripheral circuits including the row scanning section 131, the horizontal selection section 123, the column scanning section 134, and the like on the basis of the various timing signals generated by the timing generator.

Selection is preferably performable between a photographing mode using the cooling device E (for example, low noise photographing), and another photographing mode not using the cooling device E. Such switching of the photographing mode is allowed to be performed, for example, on the same operation screen as that for turning on and off of a power source of the imaging unit 1.

(Operation)

The imaging unit 1 acquires a signal charge (here, an electron), for example, in the following way. When light L enters the imaging unit 1 through the on-chip lens 35, the light L passes through the color filter 34 and the like to be detected (absorbed) by the PD 12 in each pixel P, causing red, green, or blue color light to be photoelectrically converted. Of an electron-hole pair generated in the PD 12, the electron moves to and is accumulated in the semiconductor substrate 11 (for example, an n-type semiconductor region in the Si substrate), whereas a hole moves to the p-type region and is discharged therefrom.

In a case where the photographing mode using the cooling device E is selected, the cooling of the semiconductor substrate 11 (the PD 12) by the cooling device E is started before the acquisition of signal charge (before photographing). After the cooling is sufficiently performed, the signal charge is acquired. An end point of the sufficient cooling is a timing at which a meter previously set to measure the degree of cooling reaches 100%.

(Workings•Effects)

In the imaging unit 1 of the present embodiment, the heat conductive wiring line 33 is provided in contact with the semiconductor substrate 11, thereby efficiently cooling the semiconductor substrate 11 using the cooling device E via the heat conductive wiring line 33. This is described below.

As a method of suppressing a dark current, a method of cooling a module as a whole can be considered (for example, see PTL 1). However, this method has low cooling efficiency for the photoelectric converter, and therefore necessitates a large amount of electric power to sufficiently cool the photoelectric converter. Furthermore, a long cooling time is also required. For this reason, an internal battery having a large capacity is required, making it difficult to reduce a size of the unit. For example, an imaging unit that has a cooling function of the photoelectric converter is not portable, which makes its application limited.

In contrast, in the imaging unit 1 of the present embodiment, the heat conductive wiring line 33 is provided in the pixel isolation trench 11A of the semiconductor substrate 11 and is in contact with the semiconductor substrate 11. Further, since the pixel isolation trench 11A is provided between the adjacent pixels P (PDs 12), the heat conductive wiring line 33 is disposed at a position close to the PD 12. Therefore, the PD 12 provided in the semiconductor substrate 11 is efficiently cooled via the heat conductive wiring line 33 coupled to the cooling device E.

Thus, the imaging unit 1 cools the PD 12 more efficiently compared with a method of cooling an entire module, resulting in a reduced power amount required to sufficiently cool the PD 12. Furthermore, the cooling time is also shortened. This makes it possible to reduce the size of the unit and to apply the imaging unit to portable applications (mobile products), for example.

As described above, in the present embodiment, since the heat conductive wiring line 33 is provided in contact with the semiconductor substrate 11, the PD 12 provided in the semiconductor substrate 11 can be efficiently cooled, as compared with a case where the semiconductor substrate 11 is indirectly cooled. Accordingly, it is possible to cool the PD 12 more efficiently.

Modification examples of the above-described embodiment will be described below. In the following description, the same components as those of the above-described embodiment are designated by the same reference numerals, and a description thereof will be omitted as appropriate.

MODIFICATION EXAMPLE 1

FIG. 8 illustrates a schematic configuration of a main portion of an imaging unit (an imaging unit 1A) according to modification example 1 of the above-described embodiment. In this imaging unit 1A, the cooling device E is provided in the peripheral region 110B of the semiconductor substrate 11. Except for this point, the imaging unit 1A according to the modification example 1 has a configuration, workings, and effects similar to those of the imaging unit 1 of the above-described embodiment.

The cooling device E provided in the peripheral region 110B of the semiconductor substrate 11 is disposed approximately in the same layer as the PD 12 in the light receiving region 110A. An insulating film 50 is provided between the light receiving region 110A and the cooling device E. The cooling device E includes a p-type semiconductor portion 51 and an n-type semiconductor portion 52 which are provided in the semiconductor substrate 11. The cooling device E also includes a metal portion 53 disposed between the p-type semiconductor portion 51 and the n-type semiconductor portion 52. That is, the cooling device E provided in this semiconductor substrate 11 utilizes the Peltier effect.

A plurality of p-type semiconductor portions 51 and a plurality of n-type semiconductor portions 52 are provided in the peripheral region 110B of the semiconductor substrate 11. The p-type semiconductor portion 51 and the n-type semiconductor portion 52 are separated from each other by the metal portion 53. The plurality of p-type semiconductor portions 51 and the plurality of n-type semiconductor portions 52 are alternately disposed along a plane direction (the Y direction in FIG. 8) of the semiconductor substrate 11. The p-type semiconductor portion 51 is formed, for example, by diffusing a p-type impurity into the semiconductor substrate 11. The n-type semiconductor portion 52 is formed, for example, by diffusing an n-type impurity into the semiconductor substrate 11. The p-type semiconductor portion 51 and the n-type semiconductor portion 52 can be formed, for example, in the same step as a formation step of the PD 12. The metal portion 53 is formed, for example, by embedding tungsten (W) or the like in the semiconductor substrate 11. It is possible to form the metal portion 53, for example, in the same step as the heat conductive wiring line 33. The metal portion 53 may include, for example, aluminum (Al), copper (Cu), titanium (Ti), tantalum (Ta), platinum (Pt), cobalt (Co), or the like.

A plurality of metal portions 53 is provided along a direction in which the p-type semiconductor portions 51 and the n-type semiconductor portions 52 are arranged (the Y direction in FIG. 8). The metal portions 53 serving as heat absorbing electrodes and the metal portions 53 serving as the heat radiating electrodes are alternately disposed. The metal portion 53 serving as the heat radiating electrode is coupled to a heat radiating wiring line 54. This heat radiating wiring line 54 is drawn out to an outside of the semiconductor substrate 11 and radiates heat outside the semiconductor substrate 11. The metal portion 53 serving as the heat absorbing electrode is coupled to a heat absorbing wiring line 55. This heat absorbing wiring line 55 is provided in the insulating film 50 between the cooling device E and the light receiving region 110A. The heat absorbing wiring line 55 is coupled to the heat conductive wiring line 33 in the light receiving region 110A. In other words, the metal portion 53 serving as the heat absorbing electrode is thermally coupled to the heat conductive wiring line 33 via the heat absorbing wiring line 55. This allows the cooling device E provided in the peripheral region 110B to cool the PD 12 in the light receiving region 110A.

An area occupied by the cooling device E may be varied as appropriate in accordance with size, application, and the like of the imaging unit 1A. The cooling effect obtained by the cooling device E can be estimated by using an existing calculation formula. For example, in a case where a region corresponding to effective pixels is cooled by 30 Kelvins when using the imaging unit 1A as a mobile application, each of the p-type semiconductor portion 51 and the n-type semiconductor portion 52 may be provided with a width corresponding to three pixels and a length corresponding to ten pixels.

As in the present modification example, the cooling device E may be provided in the semiconductor substrate 11. In this case, an effect similar to that of the above-described embodiment can also be obtained. Further, it is possible to reduce the size of the imaging unit 1A, as compared with the above-described imaging unit 1, because there is no need for any cooling device outside the semiconductor substrate 11. Furthermore, there is also no need for the step of coupling the cooling device outside the semiconductor substrate 11 to the heat conductive wiring line 33 of the semiconductor substrate 11. This simplifies the manufacturing process, as compared with the imaging unit 1, making it possible to reduce the cost.

MODIFICATION EXAMPLE 2

FIG. 9 schematically illustrates a cross-sectional configuration of an imaging unit (an imaging unit 2) according to a modification example of the above-described embodiment. This imaging unit 2 has a stacked structure including a first semiconductor chip 81 and a second semiconductor chip 82. The present technology is also applicable to such a stacked-type imaging unit 2.

The first semiconductor chip 81 includes a first semiconductor substrate and, for example, the PD 12 and a control circuit are provided on this first semiconductor substrate. This first semiconductor chip 81 is provided with the heat conductive wiring line 33 (see FIG. 3 and the like) extending from the light receiving region 110A to the heat coupling portion 1C of the peripheral region 110B in the imaging unit 2. The first semiconductor chip 81 is provided with a plurality of contact electrodes 81C. This contact electrode 81C is exposed at a joint surface of the first semiconductor chip 81 and the second semiconductor chip 82.

The second semiconductor chip 82 includes a second semiconductor substrate opposed to the first semiconductor substrate. For example, a logic circuit including a signal processing circuit is provided on this second semiconductor substrate. The second semiconductor chip 82 is provided with a plurality of contact electrodes 82C. This contact electrode 82C is exposed at a joint surface of the second semiconductor chip 82 and the first semiconductor chip 81. The contact electrode 82C is coupled to the contact electrode 81C of the first semiconductor chip 81. The contact electrodes 81C and 82C each include, for example, a pad of copper (Cu). That is, the first semiconductor chip 81 and the second semiconductor chip 82 are electrically coupled, for example, by a Cu—Cu joint. For example, the control circuit of the first semiconductor chip 81 and the signal processing circuit of the second semiconductor chip 82 are electrically coupled via the contact electrodes 81C and 82C.

The cooling device E is provided to be stacked on the first semiconductor chip 81 and the second semiconductor chip 82, for example. The cooling device E is opposed to the first semiconductor chip 81 with the second semiconductor chip 82 interposed therebetween, for example. This cooling device E is thermally coupled to the heat coupling portion 1C provided in the first semiconductor chip 81, for example, via a through electrode 82E provided in the second semiconductor chip 82.

As in the present modification example, the present technology may be applied to the stacked-type imaging unit 2, whereby the cooling device E and the heat coupling portion 1C (the heat conductive wiring line 33) may be thermally coupled by the through electrode 82E. In this case, effects similar to those of the above-described embodiment is also obtainable.

Although FIG. 9 illustrates the imaging unit 2 in which two semiconductor chips (the first semiconductor chip 81 and the second semiconductor chip 82) are stacked on each other, the present technology may also be applied to an imaging unit in which three or more semiconductor chips are stacked.

APPLICATION EXAMPLES

The above-described imaging units 1, 1A, and 2 are applicable to all types of electronic apparatuses having an imaging function. The imaging units 1, 1A, and 2 are applicable to, for example, a camera system including a digital still camera, a video camera, and the like, a cellular phone, a smartphone, etc. As an example, FIG. 10 illustrates an outline of a configuration of an electronic apparatus 9 (a camera). This electronic apparatus 9 is, for example, a camera that enables capturing a still image or a moving image. The electronic apparatus 9 includes the imaging unit 1, 1A, or 2, an optical system (an optical lens) 310, a shutter unit 311, a driving unit 313 that drives the imaging unit 1, 1A, or 2 and the shutter unit 311, and a signal processing unit 312.

The optical system 310 guides image light (incident light) from a subject to the imaging unit 1 or 2. This optical system 310 may include a plurality of optical lenses. The shutter unit 311 controls a light irradiation period and a light shielding period with respect to the imaging unit 1 or 2. The driving unit 313 controls a transfer operation of the imaging unit 1 or 2 and a shutter operation of the shutter unit 311. The signal processing unit 312 performs various types of signal processing on signals outputted from the imaging unit 1 or 2. An image signal Dout after the signal processing is stored in a storage medium such as a memory, or alternatively outputted to a monitor or the like.

Furthermore, the imaging units 1, 1A, and 2 described in the present embodiment and the like can also be applied to the following electronic apparatuses (mobile bodies such as a vehicle).

<Adaptation Examples to Mobile Bodies>

The technology according to the present disclosure may be adapted to a variety of products. For example, the technology according to the present disclosure may be implemented as an apparatus that is mounted on any type of mobile body such as an automobile, an electric vehicle, a hybrid electric vehicle, a motorcycle, a bicycle, a personal mobility, an airplane, a drone, a ship, a robot, a construction machine, and an agricultural machine (a tractor).

FIG. 11 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 11, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 11, an audio speaker 12061, a display section 12062, and an instrument panel 12063 are illustrated as the output device. The display section 12062 may, for example, include at least one of an on-board display and a head-up display.

FIG. 12 is a diagram depicting an example of the installation position of the imaging section 12031.

In FIG. 12, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 12 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to an imaging section 12031 in the configuration described above. Specifically, the imaging unit 1 or the like illustrated in FIG. 1 is applicable to the imaging section 12031. Applying the technology according to the present disclosure to the imaging section 12031 allows a more visible photographed image to be obtainable. This makes it possible to reduce fatigue of a driver.

Although the embodiments, the modification examples, and the like have been described above, the contents of the present disclosure are not limited to the above embodiments and the like, and various modifications can be made. For example, the configuration of the imaging unit described in the above embodiment is illustrative and may further include another layer. Further, the materials and thicknesses of the respective layers are also illustrative and not limited to those mentioned above.

Moreover, although the back-illuminated imaging unit has been described as an example in the above embodiments and the like, the present technology is also applicable to a front-illuminated imaging unit.

Furthermore, in the above-described embodiments and the like, a description has been given of a case where the heat conductive wiring line 33 has the high heat conductivity and the light shielding property; however, it is sufficient that the heat conductive wiring line 33 has the heat conductivity and the heat conductive wiring line 33 may not have the light shielding property. In addition, in the above-described embodiments and the like, a description has been given of a case where the heat conductive wiring line 33 is provided in the pixel isolation trench 11A; however, it is sufficient that the heat conductive wiring line 33 is in contact with the semiconductor substrate 11 and the heat conductive wiring line 33 may be provided at another position. The pixel isolation trench 11A may be filled, for example, with the protective film 17 or the like.

Moreover, the present technology is also applicable to an imaging unit (a solid-state imaging unit) that has an organic photoelectric conversion layer together with a semiconductor substrate provided with a photoelectric converter.

The effects described in the above-mentioned embodiments and the like are illustrative. Other effects may be provided, or other effects may be further included.

It is to be noted that the present disclosure may have the following configurations.

According to the present disclosure with the configurations below, since the heat conductive wiring line is provided in contact with the first semiconductor substrate, the photoelectric converter provided in the first semiconductor substrate can be efficiently cooled, for example, as compared with a case where the first semiconductor substrate is indirectly cooled. It is therefore possible to cool the photoelectric converter more efficiently.

(1)
An imaging unit, including:
a first semiconductor substrate including a photoelectric converter;
a heat conductive wiring line provided in contact with the first semiconductor substrate; and
a cooling device that controls a temperature of the photoelectric converter via the heat conductive wiring line.

(2)
The imaging unit according to (1) described above, in which
the first semiconductor substrate has a trench, and
the heat conductive wiring line is embedded in the trench.

(3)
The imaging unit according to (2) described above, including
a plurality of the photoelectric converters, in which
the trench is provided between adjacent ones of the photoelectric converters.

(4)
The imaging unit according to any one of (1) to (3) described above, in which the heat conductive wiring line includes a material that has a light shielding property against light incident on the photoelectric converters.

(5)
The imaging unit according to any one of (1) to (4) described above, in which the heat conductive wiring line includes tungsten (W), copper (Cu), titanium (Ti), tantalum (Ta), aluminum (Al), ruthenium (Ru), or carbon graphite.

(6)
The imaging unit according to any one of (1) to (5) described above, in which
the first semiconductor substrate is provided with a light receiving region in which the photoelectric converter is provided and a peripheral region outside the light receiving region, and
the heat conductive wiring line is provided in the light receiving region and extends from the light receiving region to the peripheral region.

(7)
The imaging unit according to (6) described above, in which the heat conductive wiring line is provided on a light receiving surface of the first semiconductor substrate and includes a solid film portion in the peripheral region.

(8)
The imaging unit according to (6) or (7) described above, in which the heat conductive wiring line is thermally coupled to the cooling device in the peripheral region.

(9)
The imaging unit according to any one of (1) to (8) described above, in which the heat conductive wiring line is thermally coupled to the cooling device by wire bonding.

(10)
The imaging unit according to any one of (1) to (8) described above, in which the cooling device is provided to be opposed to the first semiconductor substrate.

(11)
The imaging unit according to (10) described above, further including
a second semiconductor substrate stacked on the first semiconductor substrate, the second semiconductor substrate being electrically coupled to the first semiconductor substrate, in which
the cooling device is opposed to the first semiconductor substrate with the second semiconductor substrate interposed therebetween.

(12)
The imaging unit according to (11) described above, further including a through electrode provided in the second semiconductor substrate, the through electrode thermally coupling the heat conductive wiring line and the cooling device.

(13)
The imaging unit according to any one of (1) to (12) described above, in which the cooling device includes a Peltier device.

(14)

The imaging unit according to any one of (1) to (8) described above, in which
the first semiconductor substrate is provided with a light receiving region in which the photoelectric converter is provided and a peripheral region outside the light receiving region, and
the cooling device is provided in the peripheral region.

(15)

The imaging unit according to (14) described above, in which the cooling device includes a P-type semiconductor portion, an N-type semiconductor portion, and a metal portion, the P-type semiconductor portion and the N-type semiconductor portion being provided in the first semiconductor substrate, the metal portion being disposed between the P-type semiconductor portion and the N-type semiconductor portion.

(16)

The imaging unit according to (15) described above, in which the heat conductive wiring line is coupled to the metal portion.

The present application claims the priority on the basis of Japanese Patent Application No. 2017-203311 filed on Oct. 20, 2017 with Japan Patent Office and Japanese Patent Application No 2018-159996 filed on Aug. 29, 2018 with Japan Patent Office, the entire contents of which are incorporated in the present application by reference.

Those skilled in the art could assume various modifications, combinations, subcombinations, and changes in accordance with design requirements and other contributing factors. However, it is understood that they are included within a scope of the attached claims or the equivalents thereof.

The invention claimed is:

1. An imaging unit, comprising:
a first semiconductor substrate including a photoelectric converter;
a second semiconductor substrate stacked on the first semiconductor substrate, wherein the second semiconductor substrate is electrically coupled to the first semiconductor substrate;
a heat conductive wiring line in contact with the first semiconductor substrate; and
a cooling device configured to a temperature of the photoelectric converter via the heat conductive wiring line, wherein
the cooling device is opposite to the first semiconductor substrate, and
the second semiconductor substrate is between the cooling device and the first semiconductor substrate.

2. The imaging unit according to claim 1, wherein
the first semiconductor substrate has a trench, and
the heat conductive wiring line is in the trench.

3. The imaging unit according to claim 2, comprising
a plurality of photoelectric converters, wherein the trench is between adjacent photoelectric converters of the plurality of photoelectric converters.

4. The imaging unit according to claim 3, wherein a material of the heat conductive wiring line has a light shielding property associated with against light incident on the plurality of photoelectric converters.

5. The imaging unit according to claim 1, wherein the heat conductive wiring line includes one of tungsten (W), copper (Cu), titanium (Ti), tantalum (Ta), aluminum (Al), ruthenium (Ru), or carbon graphite.

6. The imaging unit according to claim 1, wherein
the first semiconductor substrate further includes a light receiving region and a peripheral region that is outside the light receiving region,
the light receiving region includes the photoelectric converter,
the heat conductive wiring line is in the light receiving region, and
the heat conductive wiring line extends from the light receiving region to the peripheral region.

7. The imaging unit according to claim 6, wherein
the heat conductive wiring line is on a light receiving surface of the first semiconductor substrate, and
the heat conductive wiring line includes a solid film portion in the peripheral region.

8. The imaging unit according to claim 6, wherein the heat conductive wiring line is thermally coupled to the cooling device in the peripheral region.

9. The imaging unit according to claim 8, wherein the heat conductive wiring line is thermally coupled to the cooling device by wire bonding.

10. The imaging unit according to claim 1, further comprising a through electrode in the second semiconductor substrate, wherein the cooling device is thermally coupled with the heat conductive wiring line based on the through electrode.

11. The imaging unit according to claim 1, wherein the cooling device comprises a Peltier device.

12. The imaging unit according to claim 1, wherein
the first semiconductor substrate further includes light receiving region and a peripheral region,
the light receiving region includes the photoelectric converters,
the peripheral region is outside the light receiving region, and
the cooling device is in the peripheral region.

13. The imaging unit according to claim 12, wherein
the cooling device includes a P-type semiconductor portion, an N-type semiconductor portion, and a metal portion,
the P-type semiconductor portion and the N-type semiconductor portion is in the first semiconductor substrate, and
the metal portion is between the P-type semiconductor portion and the N-type semiconductor portion.

14. The imaging unit according to claim 13, wherein the heat conductive wiring line is coupled to the metal portion.

15. An imaging unit, comprising:
a first semiconductor substrate that includes a light receiving region and a peripheral region, wherein
the light receiving region includes a photoelectric converter, and
the peripheral region is outside the light receiving region;
a heat conductive wiring line in contact with the first semiconductor substrate; and
a cooling device configured to control a temperature of the photoelectric converter via the heat conductive wiring line, wherein
the cooling device is in peripheral region,
the cooling device includes a P-type semiconductor portion, an N-type semiconductor portion, and a metal portion, the P-type semiconductor portion and the N-type semiconductor portion is in the first semiconductor substrate, and the metal portion is between the P-type semiconductor portion and the N-type semiconductor portion.

* * * * *